United States Patent [19]

Tserng

[11] Patent Number: 4,621,239
[45] Date of Patent: Nov. 4, 1986

[54] GALLIUM ARSENIDE TRAVELLING-WAVE TRANSISTOR OSCILLATORS FOR MILLIMETER WAVE APPLICATIONS

[75] Inventor: Hua Q. Tserng, Dallas, Tex.

[73] Assignee: Texas Instruments Incorporated, Dallas, Tex.

[21] Appl. No.: 717,741

[22] Filed: Mar. 29, 1985

[51] Int. Cl.[4] .......................... H03B 5/18; H03B 5/24
[52] U.S. Cl. ...................................... 331/99; 331/115; 331/108 R
[58] Field of Search ........... 331/108 R, 108 B, 108 D, 331/115, 117 FE, 117 D, 96, 99, 50, 52, 56; 330/54

[56] References Cited

U.S. PATENT DOCUMENTS

| | | | |
|---|---|---|---|
| 2,958,046 | 10/1960 | Watters | 330/54 |
| 4,486,719 | 12/1984 | Ayasli | 330/54 X |
| 4,540,954 | 9/1985 | Apel | 330/54 X |

FOREIGN PATENT DOCUMENTS 45-32004  10/1970  Japan ............................. 331/117 D Primary Examiner—Siegfried H. Grimm
Attorney, Agent, or Firm—Carlton H. Hoel; James T. Comfort; Melvin Sharp

[57] ABSTRACT

The disclosure relates to a gallium arsenide travelling-wave transistor oscillator which extends the oscillation frequency of the individual FETs by connecting them in parallel across a pair of inductive arrangements, either in common-gate or common-source configurations.

14 Claims, 4 Drawing Figures

GALLIUM ARSENIDE TRAVELLING-WAVE TRANSISTOR OSCILLATORS FOR MILLIMETER WAVE APPLICATIONS

BACKGROUND OF THE INVENTION

1. Field of the Invention

This invention relates to millimeter wave oscillators and, more specifically, to a gallium arsenide travelling-wave transistor oscillator having extended oscillation frequency.

2. Summary of the Prior Art

Monolithic gallium arsenide integrated circuit technology has been found suitable for system applications at millimeter wave frequencies because of the size advantage thereof and ease of control of parasitics. Typical applications are single chip receivers having a mixer, a local oscillator and an IF amplifier on the same chip.

In the prior art, the oscillator has been provided by use of a discrete gallium arsenide field effect transistor in the oscillator circuit. These gallium arsenide field effect transistors displayed frequency limitations of operation due to their intrinsic properties. It is readily apparent that it is desirable to extend the frequency range of oscillators as far as possible. Attempts to use other types of devices such as GUNN or IMPATT diodes have provided results inferior to gallium arsenide FETs because of the lower efficiency thereof due to thermal problems. Furthermore gallium arsenide FETs have been more desirable than the GUNN or IMPATT devices because the semi-insulating property of the FET substrate is more compatible with monolithic integration with other types of components.

Conventional circuit feedback techniques, such as common-gate, common-drain and the like have generally been used in conjunction with gallium arsenide FET oscillators at frequencies below 20 gigahertz. These oscillators have generally displayed a maximum oscillator frequency, $f_{max}$, of approximately 40 gigahertz. Circuit parasitics of such devices have generally limited the operating frequency to about one-half of $f_{max}$ or about 20 gigahertz as mentioned hereinabove. In order to extend the upper oscillation frequency limit in the prior art, harmonic extraction of a fundamental frequency oscillator has generally been used, but only at the expense of greater circuit complexity and concommitant increases in cost.

SUMMARY OF THE INVENTION

In accordance with the present invention, there is provided a gallium arsenide travelling-wave transistor oscillator for millimeter wave application with extended frequency range and wherein increase in circuit complexity is minimized. This is accomplished by increasing the negative resistance of the oscillator circuit as compared with the prior art discrete gallium arsenide field effect transistors. Briefly, a simple travelling-wave transistor oscillator configuration is provided in either common-source or common-gate mode. In the common-source mode, three gallium arsenide FETs are connected in parallel across either a transmission line or across inductors connected between the drains of each of the FETs and the sources of each of the FETs, the output being taken from the drain of the last FET in the configuration. All of the remaining gate and drain elements of the two endmost FETs in the configuration in the common-source configuration are coupled through an inductance to a reference source.

In the case of the common-gate configuration, the same arrangement as disclosed for the common-source configuration is provided except that the inductors are provided between the gates and ground and the source and drain electrodes are coupled to the transmission lines or discrete inductors. In the case of the common-source configuration, due to the intrinsic feedback capacitance between the drain and the gate and the travelling-wave interaction, the negative resistance at frequencies approaching $f_{max}$ can be achieved. When the interconnecting inductances are properly optimized, oscillation at extremely high frequencies is obtained. The same results are obtained in the common-gate mode as discussed hereinabove with reference to the common-source mode except that, in this case, the feedback is provided by the inductor in the gate circuit. It is therefore apparent that a gallium arsenide travelling-wave transistor oscillator for millimeter wave applications is provided which has extended range relative to prior art gallium arsenide systems of this type.

DESCRIPTION OF THE PREFERRED EMBODIMENTS

Figure 1:
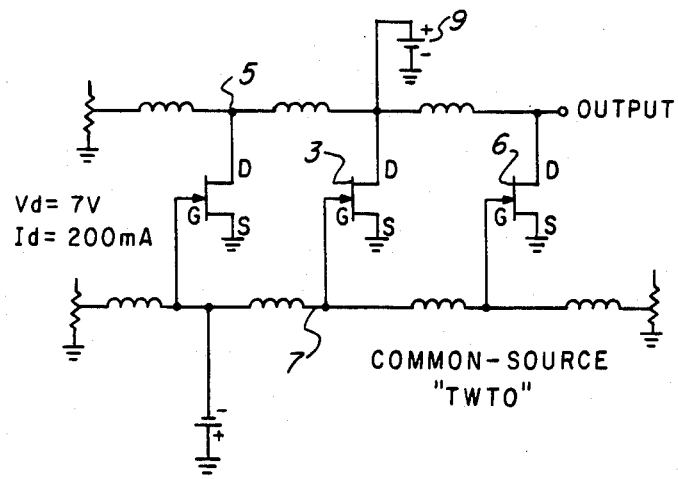
FIG. 1 is a circuit diagram of a gallium arsenide travelling-wave transistor oscillator in the common-source configuration in accordance with the present invention.

Referring first to FIG. 1, there is shown a circuit diagram of a gallium arsenide transistor oscillator which includes three gallium arsenide FET transistors 1, 3 and 5, each having a drain D, source S and gate G electrode. The drain electrodes D are coupled to a transmission line 5 which is represented as a plurality of discrete inductors, it being understood that discrete inductors themselves can be used as shown in place of the transmission line. The gate electrodes G of each of the transistors 1, 3 and 5 are connected to a transmission line 7, which is shown as a plurality of discrete inductors, it again being understood that individual inductors can be used as shown in the circuit in place of the transmission line. The transmission line 5 is coupled through a battery 9 to a source of reference voltage and the transmission line 7 is coupled to a source of reference voltage as shown. The output power of the oscillator of FIG. 1 is determined by the voltage of the battery 9, this power increasing up to a saturation point after which it will begin to decrease, as is well known. The frequency of oscillation of the oscillator is determined by the inductance in the transmission lines 5 and 7 or by the value of the discrete inductors when discrete inductors are used.

Figure 2:
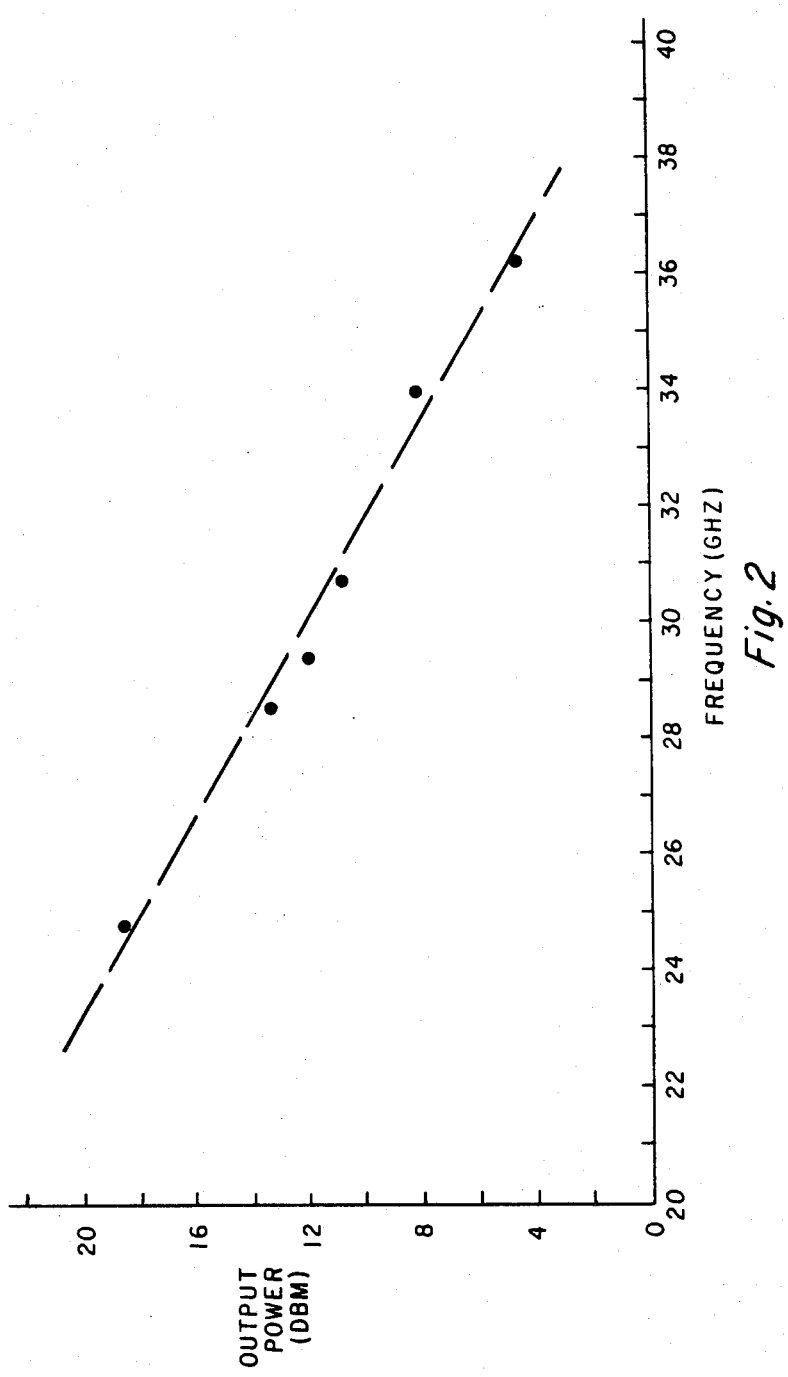
FIG. 2 is a graph of the output power in dBm versus frequency in gigahertz for the circuit of FIG. 1 with the battery voltage being 7 volts and the drain current being 200 milliamperes.

Referring now to FIG. 2, there is shown a graph of output power in dBm versus frequency in gigahertz with a battery voltage of 7 volts and a current of 200 milliamperes in the drain circuits. It can be seen that the output power decreases with increase in frequency.

Figure 3:
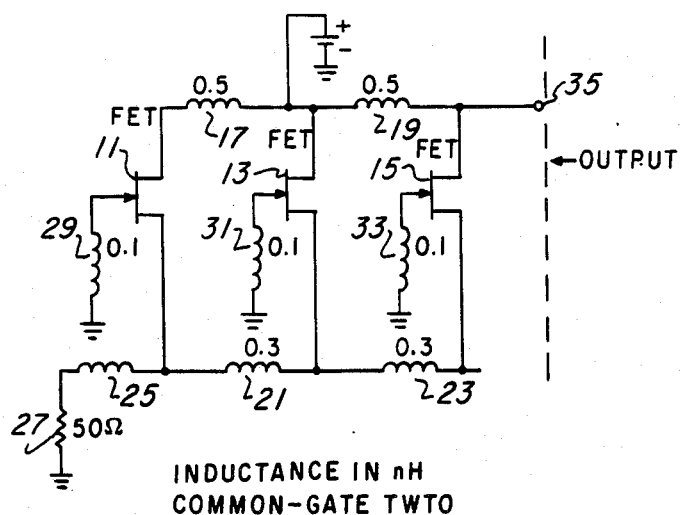
FIG. 3 is a circuit diagram of a second embodiment of the invention utilizing the common-gate mode.

Referring now to FIG. 3, there is shown a gallium arsenide transistor oscillator in the common-gate mode in accordance with the second embodiment of the invention. In this embodiment there are shown gallium arsenide FET transistors 11, 13 and 15, each having a drain, source and gate electrode. In this embodiment, the drain electrodes are coupled together by discrete inductors 17 and 19 and the source electrodes are connected together by inductors 21 and 23, the source of the first transistor 11 being coupled through an inductor 25 and a resistor 27 to ground. Each of the gate electrodes is connected to ground through an inductor 29, 31 and 33, the inductors 29, 31 and 33 providing feedback which is the same in function as the intrinsic capacitance between the drain and the gate in the embodiment of FIG. 1. The output 35 is taken from the drain electrode of the last transistor 15 of the group. The frequency of the oscillator circuit is determined by the value of the inductors 29, 31 and 33.

Figure 4:
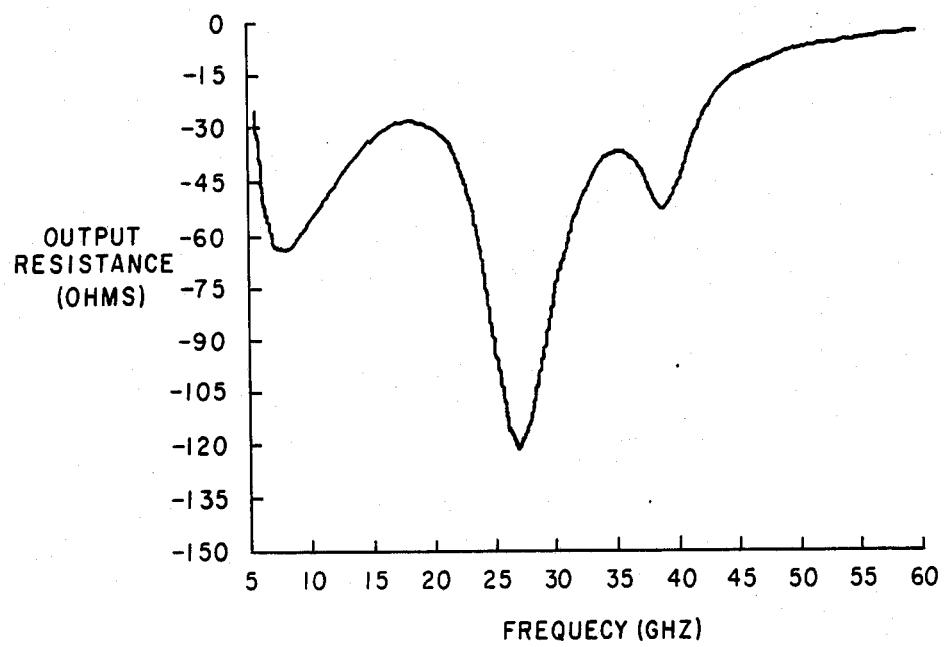
FIG. 4 is a graph of the output resistance in ohms versus the frequency in gigahertz for the circuit of FIG. 3.

Referring to FIG. 4, there is shown a graph of output resistance in ohms versus frequency in gigahertz for the circuit of FIG. 3 wherein the inductors 17 and 19 have a value of 0.5 nanohenry, the inductors 21 and 23 have an inductance of 0.3 nanohenrys and the inductors 29, 31 and 33 have an inductance of 0.1 nanohenrys. Also, the resistor 27 has a value of 50 ohms and the inductor 25 has a value of 0.3 nanohenrys. It can be seen with reference to FIG. 4 that there is a negative resistance peak at a frequency slighly in excess of 25 gigahertz. It is also readily apparent that by altering the values of the components of the circuit of FIG. 3, the negative peak value shown in FIG. 4 can be shifted to higher or lower frequencies. With the use of short gate length FETs having $f_{max}$ approaching 100 gigahertz, the travelling-wave oscillator configuration can generally be implemented for monolithic receiver applications in the 70 to 100 gigahertz band.

It can readily be seen that there is provided a gallium arsenide travelling-wave transistor oscillator for millimeter wave application which displays enhanced frequency response relative to prior art gallium arsenide transistors with minimal complexity added in the circuit.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

What is claimed is:

1. A travelling-wave oscillator which comprises:
   (a) a plurality of semiconductor devices formed of a group III–V material, each device having gate, source and drain electrodes,
   (b) first inductive means coupled between the drain electrodes of each of said devices,
   (c) second inductive means coupled between the source electrodes of each of said devices,
   (d) a source of reference voltage,
   (e) a plurality of inductors, each inductor coupled between each of said gate electrodes and said source of reference voltage,
   (f) output means coupled to the drain electrode of one of said devices, and
   (g) a source of power connected to said first inductive means.

2. A travelling-wave oscillator as set forth in claim 1 wherein said group III–V material is gallium arsenide.

3. A travelling-wave oscillator as set forth in claim 1 wherein said first inductive means comprises an inductor connected between the drain electrodes of each pair of adjacent devices.

4. A travelling-wave oscillator as set forth in claim 2 wherein said first inductive means comprises an inductor connected between the drain electrodes of each pair of adjacent devices.

5. A travelling-wave oscillator as set forth in claim 1 wherein said second inductive means comprises an inductor connected between the source electrodes of each pair of adjacent devices.

6. A travelling-wave oscillator as set forth in claim 2 wherein said second inductive means comprises an inductor connected between the source electrodes of each pair of adjacent devices.

7. A travelling-wave oscillator as set forth in claim 3 wherein said second inductive means comprises an inductor connected between the source electrodes of each pair of adjacent devices.

8. A travelling-wave oscillator as set forth in claim 4 wherein said second inductive means comprises an inductor connected between the source electrodes of each pair of adjacent devices.

9. A travelling-wave oscillator as set forth in claim 1 wherein said second inductive means is a transmission line.

10. A travelling-wave oscillator as set forth in claim 2 wherein said second inductive means is a transmission line.

11. A travelling-wave oscillator as set forth in claim 3 wherein said second inductive means is a transmission line.

12. A travelling-wave oscillator as set forth in claim 4 wherein said second inductive means is a transmission line.

13. A travelling-wave oscillator as set forth in claim 7 wherein said second inductive means is a transmission line.

14. A travelling-wave oscillator as set forth in claim 8 wherein said second inductive means is a transmission line.

* * * * *